United States Patent
Brandt et al.

[11] Patent Number: 5,922,397
[45] Date of Patent: Jul. 13, 1999

[54] METAL-PLATING OF CURED AND SINTERED TRANSIENT LIQUID PHASE SINTERING PASTES

[75] Inventors: Lutz Brandt, Carlsbad; Pradeep Gandhi, Del Mar; Bryan Shearer, Vista, all of Calif.

[73] Assignee: Ormet Corporation, Carlsbad, Calif.

[21] Appl. No.: 08/816,401

[22] Filed: Mar. 3, 1997

[51] Int. Cl.$^6$ ....................................................... B05D 5/12
[52] U.S. Cl. ......................... 427/98; 427/125; 427/304; 427/372.2; 427/437
[58] Field of Search ............................ 427/98, 125, 256, 427/304, 372.2, 437, 443.1, 265; 252/512, 513, 514

[56] References Cited

U.S. PATENT DOCUMENTS

| | | | |
|---|---|---|---|
| 4,404,237 | 9/1983 | Eichelberger et al. | 427/96 |
| 4,747,211 | 5/1988 | Gilleo et al. | 29/852 |
| 4,789,411 | 12/1988 | Eguchi et al. | 148/24 |
| 4,954,226 | 9/1990 | Mahmoud | 204/15 |
| 4,960,236 | 10/1990 | Hedges et al. | 228/180.1 |
| 4,996,005 | 2/1991 | Saito et al. | 252/512 |
| 5,272,596 | 12/1993 | Honore et al. | 361/633 |
| 5,538,789 | 7/1996 | Capote et al. | 428/344 |
| 5,603,158 | 2/1997 | Murata et al. | 29/846 |
| 5,716,663 | 2/1998 | Capote et al. | 427/96 |

Primary Examiner—Brian K Talbot
Attorney, Agent, or Firm—Gary Cary Ware & Freidenrich; Stephen E. Reiter

[57] ABSTRACT

In accordance with the present invention, it has been discovered that conductive traces made from transient liquid phase sintering (TLPS) pastes, plated by electroless or electrolytic means, result in improved solderability, adhesion and conductivity of the circuitry. Transient liquid phase sintering pastes employed in the practice of the present invention differ from conventional metal loaded polymer thick film (PTF) inks in that they contain, in addition to a binder, they also contain both a relatively high melting metal powder and a relatively low melting solder powder capable of forming a continuous intermetallic/metallic phase after sintering. The present invention is particularly useful, for example, for the fabrication of single and multi-layer printed circuit boards, providing horizontal and vertical conductive interconnects, metallized through-holes, and conductive pads for electronic component attachment.

11 Claims, 2 Drawing Sheets

METAL-PLATING OF CURED AND SINTERED TRANSIENT LIQUID PHASE SINTERING PASTES

FIELD OF THE INVENTION

The present invention relates to metal-plated, transient-liquid-phase-sintering (TLPS) pastes which are useful for the creation of electric circuits or electric interconnects in the printed circuit board (PCB) and multi-chip module (MCM) context. PCB's and MCM's can be single, double or multi-layer constructs.

BACKGROUND OF THE INVENTION

A printed circuit board or multi-chip module serves as a support substrate for both discrete and embedded electronic components, such as integrated circuits (ICs), resistors, capacitors, inductors, and other components. The printed circuit board or multi-chip module also provides conductive traces for conveying electric current to the terminals of the electronic components. In multi-layer constructs each layer may contain circuitry or embedded components. The layers are electrically connected by means of conductive vertical interconnects (or vias) buried inside the multi-layer structure. Attachment of discrete components is generally accomplished by means of soldering to metallized through-holes or conductive pads or lands.

In recent years, electronic devices have increasingly employed printed circuits made from polymer thick film (PTF) inks. Typically, these films are applied to the substrate by screen-printing. This additive method is environmentally less harmful and much more cost-effective than other known methods of wiring such as, for example, chemical etching of copper foil. The majority of PTF inks employed for the production of electrically conductive traces are thermosetting or thermoplastic resin pastes with silver or copper powder as the conductor. Unfortunately, the PTF ink compositions are not comparable to copper foil wiring in terms of conductivity and adhesion and are at best only poorly solderable. Metal-filled PTF inks also suffer from degradation of electrical conductivity with aging after curing, and they respond poorly to temperature and humidity fluctuations, presumably due to polymer expansion.

In order to be rendered solderable, conductive polymer thick films as currently employed in the art need to be plated with a solderable metal surface. Plating is typically carried out by electroless or electrolytic metal plating. These techniques are well known to those skilled in the art. Plated PTF inks have been used to create conductive and solderable electronic circuit traces as well as plated through-holes for component attachment in printed circuit boards. PTF inks selected for plating typically contain a conductive filler material such as copper, silver or carbon black, along with a thermoplastic, thermosetting or radiation curable organic binder. Plating with solderable metals (e.g., copper or nickel) is achieved with various commercially available electroless and electrolytic plating baths. Often metal plating is preceded by pretreatment steps aimed at exposing the metallic surface of the PTF conductive filler particles. This may include cleaning with organic solvents, mechanical abrasion, acid-etch, and activation with a plating catalyst.

In spite of the advances in the art with respect to the use of PTF materials, improved methods for creating mechanically strong and solderable, conductive traces on printed circuit boards and multi-chip modules would be desirable. By the use of metal-plating, it is possible that a circuit can be soldered to repeatedly and without degradation of the solder-to-circuit-bond. Such improved methods may therefore find use for the attachment of electronic components to electrical circuits or for the general creation of electrical connections. Similarly, through-hole walls may be coated with TLPS paste and plated thereafter.

BRIEF DESCRIPTION OF THE INVENTION

In accordance with the present invention, we have discovered that the inherent shortcomings of PTF inks, such as limited adhesion and conductivity, as well as poor stability to temperature and humidity fluctuations, can be considerably improved by replacing such materials with conductive transient-liquid-phase-sintering (TLPS) pastes, which can be applied to the substrate in a similar fashion.

Many advantages of the present invention are due to the fact that PTF inks and TLPS pastes differ substantially in their respective chemical and physical structures. Thus, while PTF inks contain discrete metal particles (see FIG. 1), TLPS pastes provide a continuous metallic phase (see FIG. 2). Consequently the electrical current is transported through the conductive traces in a radically different way. In PTF inks, conduction relies on close contact between individual metal particles, and the current carrying electrons have to jump from one metal particle to the other, leading to a high resistance. Thus, with PTF inks, conductivity depends in large part on passive metal filler contacts.

In TLPS pastes, on the other hand, the current carrying electrons can travel along a continuous conductive path, leading to high conductivity, even at a reduced metal loading. Other benefits of the continuous metallic phase produced in accordance with the present invention are higher structural integrity, improved adhesion to the board, and strongly reduced sensitivity towards surface oxidation of the metals.

Thus, by way of a generalized summary, the invention involves metal plating of a conductive coating or film made from a transient-liquid-phase-sintering (TLPS) paste. The TLPS paste may be applied to a substrate in a variety of ways, e.g., by screen-printing, stenciling, by filling the grooves of a patterned dielectric, and the like. This is followed by heating to allow sintering and curing of the paste. The TLPS paste itself is comprised in the most general terms of a high-melting metal powder (hereinafter, metal powder), a low-melting metal powder (hereinafter, solder powder), a binder and a cross linking agent. The binder may be a thermoset, a thermoplastic, a radiation curable resin, and the like. The paste composition may further contain fluxing agents, cross-linking agents, plating activators, and the like.

Metallization of the cured coating or film can be achieved in a variety of ways, e.g., by electroless plating, electrolytic plating or combinations thereof. Plating of TLPS conductor surfaces by simple chemical displacement (immersion plating) of one metal by another is also included within the scope of the present invention. Metals contemplated for use herein for such plating purposes may be metals such as copper, nickel, palladium, gold, silver, zinc, tin, tin-lead, and the like.

Apart from providing solderability, the plated metal is also beneficial in that it heals potential microscopic defects (e.g. cracks, voids etc.) in the TLPS film, improves conductivity and adhesion as well as furnishing increased resistance against mechanical impact. Although the present invention is in particular aimed at the fabrication of electrical circuit traces, it is in principle conceivable to conformally cover larger areas or odd-sized objects for other applications with a metal-plated coating by using this method.

DETAILED DESCRIPTION OF THE INVENTION

Figure 1:
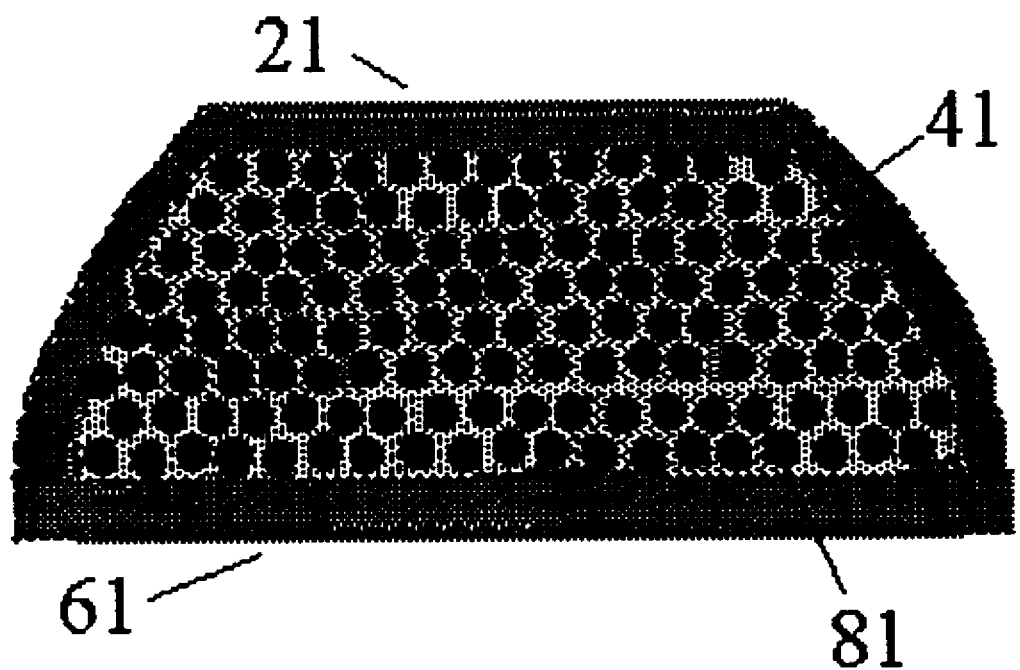
FIG. 1 is a schematic diagram of a cross-section of a plated polymer thick film conductive ink. The cross-section shows an example of the result of prior art methods wherein a prior finish 21 has been applied to a composite consisting of an organic binder 41 and discrete metal particles 81, all on a substrate board 61.
Figure 2:
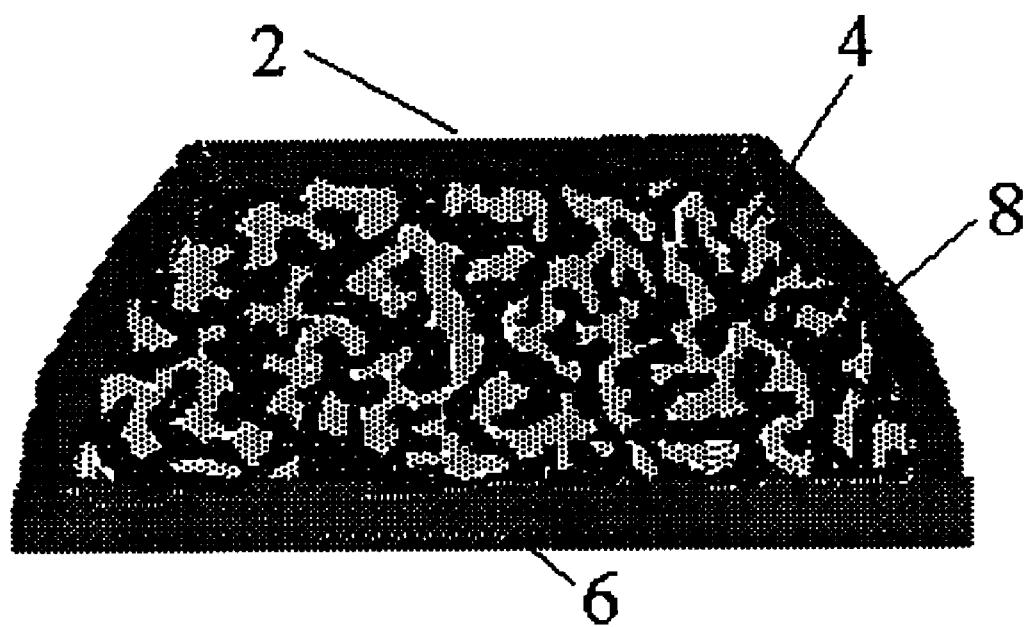
FIG. 2 is a schematic diagram of a cross-section of a plated transient liquid phase conductive paste. The cross-section shows an example of the result of an embodiment of invention methods and depicts a metal finish 2, applied to TLPS layer comprising an organic binder 4 and a metal network 8, all on a substrate board 6.

In accordance with the present invention, there are provided methods to apply a surface finish to a substrate. Invention methods comprise:

applying a transient-liquid-phase-sintering (TLPS) paste to said substrate, curing and sintering said TLPS paste, and plating the conductive surfaces created upon curing and sintering said TLPS paste.

In an alternate aspect, invention methods to apply a surface finish to a substrate comprise:

curing and sintering a transient-liquid-phase-sintering (TLPS) paste which has been applied to said substrate, and plating the conductive surfaces created upon curing and sintering said TLPS paste.

In accordance with yet another alternate aspect, invention methods to apply a surface finish to a substrate comprise plating the conductive surfaces created upon curing and sintering a transient-liquid-phase-sintering (TLPS) paste which has been applied to said substrate.

The process of the present invention involves the deposition of conductive traces onto a substrate by suitable means (e.g., by screen-printing, stenciling, filling the grooves of a patterned dielectric with TLPS paste, spray-coating and the like). Substrates contemplated for use herein are materials typically employed in the printed circuit board industry such as glass filled epoxies, polyesters, phenolics, polystyrenes, polyimides, and the like. The use of ceramic and insulated metallic substrates is also contemplated by the present invention.

TLPS pastes contemplated for use in the practice of the present invention typically contain the following:

(1) A high melting point metal or metal alloy powder;

(2) A low melting point metal or metal alloy powder (solder);

(3) A binder; and (4) A cross-linking agent comprising a latent or chemically protected curing agent, which also acts as a primary fluxing agent.

Compositions contemplated for use according to the invention can also contain other additives to improve certain properties thereof, such as adhesion, rheology, solderability, and the like. Suitable compositions typically contain either (3), or alternatively (3) may be combined with (4) into a single species, as in the case of a protected homopolymerizable resin. Similarly, it is conceivable to combine metal (1) and solder (2) components such as in the form of a solder coated metal particle.

In preparing TLPS compositions useful in the practice of the present invention, the proportions of components (1)–(4) may be varied over a considerable range and once cured still yield an electrically and thermally conductive material. Generally, compositions employed in the practice of the present invention, after curing, have a bulk electrical resistivity of less than $10^{-3}$ Ohm-cm. This electrical conductivity range can be satisfied by numerous formulations having components (1)–(4) within the following ranges:

Component (1): 5–65% of the volume of the composition;
Component (2): 5–60% by volume of the composition;
Component (3): 2–70% by volume; and
Component (4): 2–60% by volume.

Preferably, compositions employed in the practice of the present invention have a bulk electrical resistivity of $5 \times 10^{-5}$ Ohm-cm or less. This characteristic can be satisfied by numerous formulations having components (1)–(4) within the following ranges:

Component (1): 8–60% by volume of the composition;
Component (2): 6–40% by volume of the composition;
Component (3): 5–50% by volume; and
Component (4): 7–50% by volume.

In a preferred embodiment of the invention, the combined volume percent of the high melting point metal (1), and the low melting point metal (2) falls in the range of about 14 up to about 75 volume percent, based on the total volume of the composition. In such formulations, it is preferred that:

the volume percent of the crosslinking agent fall in the range of 5 up to about 55 volume percent, and the volume percent of the binder fall in the range of 5 up to about 50 volume percent.

In another preferred embodiment of the present invention, the binder (i.e., component 3) is present in an amount falling in the range of about 3 up to about 35% by volume. It is preferred that the volume ratio of the binder, relative to the volume of the crosslinking agent, falls in the range of about 0.1 up to about 10.

Typically, high melting point metal powders (i.e., component (1)) employed in the practice of the present invention are selected from elements such as aluminum, copper, silver, gold, platinum, palladium, iridium, rhodium, nickel, cobalt, iron, chromium, molybdenum, and tungsten, as well as high-melting point alloys of any two or more of these metals, may be employed. The use of suitable metal or alloy coated carrier particles such as carbon, glass, mica, and the like is also contemplated. The preferred high melting point metals contemplated for use in the present invention are copper or nickel powder, especially copper or nickel powder which is spherical or nearly spherical, as produced by gas atomization.

A spherical powder containing a wide distribution of particle sizes distributed approximately normally about an average particle diameter is preferred over monosized spheres. The wide distribution of sizes increases the density of the packed metal powder as compared to monosized spheres, improving electrical conductivity and mechanical integrity. Metal powders contemplated for use in the practice of the present invention generally have an average particle diameter of about 0.5 up to 100 microns. Preferred powders contemplated for use herein have a mean particle diameter of about 0.5 up to 50 microns.

Solder powders (i.e., component (2)) contemplated for use in the practice of the present invention include Sn, Bi, Pb, Cd, Zn, Ga, In, Hg, As, Sb, Ge, Cu, Au, Al, Ag, and the like, as well as mixtures of any two or more thereof, or another metal or alloy having a melting point lower than that of the metal powder in component (1). Typically, the powder has an average particle diameter in the range of about 0.25 up to about 100 microns. Preferably, the average particle diameter is less than or equal to the average diameter of the high melting point metal particles and the particle size distribution is substantially the same as that of the high melting point metal powder. The principal requirement of the alloy is that it melts and flows prior to the vitrification of the polymers in the composition. In order for this to occur, the solder alloy must readily wet the high melting point metal (1). For this reason, alloys of tin are presently preferred.

The binder (i.e., component (3)) functions principally to adhere the cured composition to the substrate, to provide chemical binding sites for the reaction products after curing, and to increase the cohesive strength of the cured composition. The binder also functions as a medium for delivering flux to the metal powder, as a thickening agent for the composition. In order for the composition to achieve the highest electrical and thermal conductivity, it must achieve and maintain low viscosity up to the temperature at which the solder powder melts and wets the high melting point metal (1). If the binder becomes too viscous before the solder powder has melted, it will impede the flow of the melt and reduce the degree of metal powder sintering. For this reason, the curing of the binder will desirably occur slowly, relative to the time required to reach the melting point of the solder powder.

Binders contemplated for use in the practice of the present invention include any thermosetting resin comprising monomeric or polymeric components which can be cross-linked by the curing agent, a metal catalyst, an amino or hydroxyl group-bearing agent. Binders which meet this requirement include epoxies, phenolics, novalacs (both phenolic and cresolic), polyurethanes, polyimides, bismaleimides, maleimides, cyanate esters, polyvinyl alcohols, polyesters, polyureas, and the like. The use of thermoplastic resins is also conceivable. These systems may be modified to be cross-linkable by the curing agent, a metal catalyst, an amino group bearing agent or a hydroxyl group-bearing agent. Examples of such resins are acrylics, rubbers (butyl, nitrile, etc), polyamides, polyacrylates, polyimines, polyethers, polysulfones, polyethylenes, polypropylenes, polysiloxanes, polyvinyl acetates/polyvinyl esters, polyolefins, cyanoacrylates, polystyrenes, and the like. Presently preferred resins contemplated for use in the practice of the present invention include epoxies, phenolics, novalacs (both phenolic and cresolic), polyurethanes, polyimides, maleimides, cyanate esters, polyvinyl alcohols, polyesters, polyureas, acrylics, polyamides, polyacrylates, polysiloxanes, cyanoacrylates, and the like. Especially preferred resins contemplated for use in the practice of the present invention include epoxies, phenolics, novalacs (both phenolic and cresolic), polyimides, maleimides, cyanate esters, polyesters, polyamides, polysiloxanes, and the like.

Typically, any resin would function as a binder in the practice of this invention if the resin can be modified to contain at least one of the following functional groups: anhydrides, carboxylic acids, amides, imides, amines, alcohols/phenols, aldehydes/ketones, nitro compounds, nitrites, carbamates, isocyanates, amino acids/peptides, thiols, sulfonamides, semicarbazones, oximes, hydrazones, cyanohydrins, ureas, phosphoric esters/acids, thiophosphoric esters/acids, phosphonic esters/acids, phosphites, phosphonamides, sulfonic esters/acids or other functional groups known to those of skill in the art to act as reactive sites for polymerization. For example, a polyolefin would not be suitable as a resin in the practice of the present invention, as it has no reactive sites for binding and has poor adhesive properties; however, a carboxylated polyolefin would function well when matched with a suitable cross-linking agent. A combination of these and other resins, such as non-cross-linkable thermoplastic resins, may also be used as the resin component. A multifunctional epoxy resin, combined with a phenolic novolac resin is presently preferred.

The principal feature of cross-linking agents contemplated for use herein (i.e., component (4)) is that in their unprotected form, these agents act as an acid or a strong base. Most acids and strong bases function well as fluxing agents, because they can remove oxides from metals. However, if they are left in their reactive form in the composition, they would prematurely promote cross-linking of the resin or be consumed in reactions with the metal powders. The principal property of a protected curing agent employed in the practice of the present invention is that it remains largely unreactive until it is needed to flux the metal powder and cross-link the resin. Protection may be achieved by buffering or chemically binding the agent with a chemically- or thermally-triggered species so that it becomes reactive only at or near the temperature at which the solder powder melts. Protection may also be achieved mechanically, for example by encapsulating the curing agent in a shell of non-reactive material which releases the curing agent only at or near the melting time of the solder powder.

Cross-linking agents contemplated for use in the practice of the present invention are well known in the art and can be readily identified by those of skill in the art. Thus, any agent which can promote curing of polymers and which is acidic or strongly basic can be employed in the practice of the present invention. Such agents include compounds bearing one or more functional groups selected from anhydride groups, carboxyl groups, amide groups, imide groups, amine groups, hydroxyl groups, phenolic groups, aldehyde groups, keto groups, nitro groups, nitrile groups, carbamate groups, isocyanate groups, amino acids/peptides, thiol groups, sulfonamide groups, semicarbazone groups, oxime groups, hydrazone groups, cyanohydrin groups, ureas, phosphoric esters/acids, thiophosphoric esters/acids, phosphonic esters/acids, phosphite groups, phosphonamide groups, and the like. Presently preferred compounds contemplated for use in the practice of the present invention are compounds bearing one or more functional groups selected from carboxyl, hydroxyl, amine, thiol or cyano groups, or derivatives thereof. Especially preferred crosslinking agents contemplated for use herein comprise at least two functionalities selected from anhydride, carboxyl, amine, amide, hydroxyl or cyano.

Exemplary chemically protected crosslinking agents contemplated for use in the practice of the present invention include anhydrides, carboxylic acids, amides, imides, amines, alcohols, phenols, isocyanates, cyanate esters, thiols, and the like.

Protecting groups are generally specific to the curing agent employed and are not generally applicable to all curing agents. Typical protecting groups include carboxylic acids, amides, alcohols, alkyl halides, acid halides, thiols, ureas, alkyl silanes, diazoalkanes, olefins, amines, amineols, diamine polyols, and the like. In addition, curing agents may be protected by formation of azomethanes, acetals, ketals, transition metal complexes or other curing agent precursors. There exist many such protecting groups and complexes specific to the curing agents being protected.

A presently preferred cross-linking agent contemplated for use in the practice of the present invention comprises a mixture containing mono- and polycarboxylic acids, which also carry additional ester and alcohol functions. It is of particular importance that the majority of the carboxylic acid functions are protected from reacting with the resin component and both the high melting and low melting metal powders until the flow temperature of the low melting metal powder is reached. This can be accomplished, for example, by buffering the acidic functions with a base. The protecting agent is preferably selected so that the crosslinking agent becomes only reactive at elevated temperature. A preferred group of buffering agents is tertiary amines. The use of other bases is also contemplated, e.g., pyridines, secondary amines, bulky primary amines, and the like.

It is believed that, at elevated temperatures, the reactivity of the buffered carboxylic acids increases sufficiently to turn them into effective fluxing and crosslinking agents. The carboxylic acid and other hydroxy functions of the crosslinking agent chemically attack the oxides on the surface of the metal particles until they have been completely consumed and rendered unactive by crosslinking with the resin. The metal oxides are apparently chemically immobilized in the resin system after curing, preventing them from forming caustic salts and acids. Through appropriate selection of the cross-linking agent and its protecting group, the aggressiveness of the cross-linking agent in attacking the metal oxides can be tailored to fit both the melting point of the solder component and the type of high melting point metal to be fluxed.

Crosslinking, fluxing and transient liquid phase sintering of the paste is typically achieved by heating the paste to temperatures between about 100° C. and about 500° C.

In accordance with the present invention it has been found that the cured and sintered TLPS traces can be metallized with or without prior surface preparation or activation in an electroless or electrolytic plating bath. In some instances, however, it may be desirable to employ a mechanical and/or chemical pretreatment of the TLPS traces to allow uniform and rapid metal plating. The pretreatment comprises removal of metal oxides and surface organics by mechanical abrasion followed by a brief acid etch. An additional, optional step is the activation of the exposed metal surface with a plating catalyst such as palladium. Pretreatment or activation is then followed by electroless or electrolytic metal plating in commercial plating baths.

Metals contemplated for plating in accordance with the present invention include Ni, Cu, Ag, Au, Pd, SnPb, Zn, Sn, and the like, as well as mixtures of any two or more thereof.

In accordance with another embodiment of the present invention, there are provided methods for the preparation of a circuit trace. Invention methods comprise:
applying a transient-liquid-phase-sintering (TLPS) paste to the surface of a substrate in a desired pattern,
curing and sintering said TLPS paste, and
plating the conductive surfaces created upon curing and sintering said TLPS paste.

In accordance with yet another embodiment of the present invention, there are provided methods of fabricating horizontal and vertical conductive interconnects in a multi-layer substrate. Invention methods comprise:
depositing a transient-liquid-phase-sintering (TLPS) paste onto selected portions of said substrate;
curing and sintering the TLPS paste;
electrolessly or electrolytically metal-plating the cured and sintered TLPS paste.

In an alternate aspect, invention methods of fabricating horizontal and vertical conductive interconnects in a multi-layer substrate comprise:

curing and sintering a transient-liquid-phase-sintering (TLPS) paste which has been applied to selected portions of a substrate; and
electrolessly or electrolytically metal-plating the cured and sintered TLPS paste.

In accordance with yet another alternate aspect, invention methods of fabricating horizontal and vertical conductive interconnects in a multi-layer substrate comprise:
electrolessly or electrolytically metal-plating a cured and sintered transient-liquid-phase-sintering (TLPS) paste, wherein said TLPS paste is applied to selective portions of said substrate prior to curing and sintering thereof.

In accordance with a still further embodiment of the present invention, there are provided methods of fabricating conductive pads for component attachment to a substrate. Invention methods comprise:
selectively depositing a transient-liquid-phase-sintering (TLPS) paste onto predetermined sites on a substrate;
curing and sintering the TLPS paste; and
electrolessly or electrolytically metal-plating the cured and sintered TLPS paste.

In an alternate aspect, invention methods of fabricating conductive pads for component attachment to a substrate comprise:
curing and sintering a transient-liquid-phase-sintering (TLPS) paste which has been selectively deposited onto predetermined sites on said substrate; and
electrolessly or electrolytically metal-plating the cured and sintered TLPS paste.

In accordance with yet another alternate aspect, invention methods of fabricating conductive pads for component attachment to a substrate comprise:
electrolessly or electrolytically metal-plating the conductive surfaces created upon curing and sintering a transient-liquid-phase-sintering (TLPS) paste which has been selectively deposited onto predetermined sites on a substrate.

In accordance with yet another embodiment of the present invention, there are provided methods for metallizing through-holes. Invention methods comprise electrolessly or electrolytically plating through-holes which have been coated with a transient-liquid-phase-sintering (TLPS) paste, wherein said paste is cured and sintered prior to said plating.

The invention will now be described in greater detail by reference to the following non-limiting examples.

EXAMPLE 1

Conductor stripes of the dimensions 6.20 cm in length× 1.90 cm in width×0.030 cm in height were screen-printed onto FR-4 epoxy/glass coupons. A commercial, copper based TLPS paste (ORMET® 2005) was compared against an experimental copper ink A, a commercial copper ink B, and a commercial silver ink C. While the manufacturer of copper ink B did not comment on whether this ink could be plated or not, the manufacturer of silver ink C particularly recommended this ink for plating.

Each of the above-described materials were processed according to the manufacturer's instructions. Thus, the TLPS paste and ink A were cured for 15 min. at 215° C., ink B was cured for 30 min. at 160° C., and ink C was cured for 60 min at 175° C.

The cured TLPS paste comprised about 91 wt % metal-alloy network and 9 wt % of an epoxy based organic polymer. The experimental copper ink (i.e., ink A) comprised about 88 wt % copper and 12 wt % of the same epoxy based organic polymer. The exact composition of commercial inks B and C is unknown.

After curing, the coupons were polished, and briefly dipped into dilute acid, as well as a Pd/Sn activator solution (Shipley Activator 472). The coupons were immersed for 60 min. at 44° C. into an electroless copper sulfate/formaldehyde bath (CIRCUPOSIT® ELECTROLESS COPPER 3350). Rapid formation of a continuous, fine grained copper film of about 2–3 micron thickness was observed in the case of the TLPS paste and ink A. Satisfactory plating was also observed in the absence of a polishing or Pd/Sn activation step. The commercial copper ink B was not noticeably plated under these conditions and remained unsolderable; the commercial silver ink C, in contrast, plated well.

All plated conductive traces showed a significantly reduced resistance, good solderability and good adhesion of the plated copper to the underlying material. A tensile pull test of the soldered samples, however, showed that the plated TLPS paste is superior to plated copper ink A and plated silver ink C with regard to adhesion. While the TLPS paste eventually failed at the board/paste interface, the silver ink failed within the ink, and the copper ink failed at the interface of the ink and the plated copper. The superior adhesion of the plated copper to the TLPS paste can be explained by its firm anchoring to the intermetallic network. The copper and silver PTF inks, on the other hand, only provide adhesion to the plated copper via their surface metal particles. These surface particles can be loosened comparatively easily, since they are solely held by the polymer. A summary of the findings is given in Table 1.

TABLE 1

Comparison of Copper Electroless Plating of TLPS Pastes and Copper Inks

| Conductor | R (Ω) as is | R (Ω) Polished | R (Ω) Plated | Scotch Tape Test[1] | Solder-ability[2] | Pull Test kg/cm²[3] |
|---|---|---|---|---|---|---|
| ORMET 2005 | 0.027 | — | — | n/a | fair (2) | 160 |
| ORMET 2005 | 0.027 | 0.030 | — | n/a | none | n/a |
| ORMET 2005 | 0.027 | 0.030 | 0.020 | OK | good (3–4) | 230 |
| Ink A (exp) | 300 | — | — | n/a | none | — |
| Ink A (exp) | 300 | 341 | — | n/a | none | n/a |
| Ink A (exp) | 300 | 341 | 0.020 | OK | good (3–4) | 80 |
| Ink B (com) | 0.044 | — | — | n/a | none | n/a |
| Ink B (com) | 0.044 | 0.049 | — | n/a | none | n/a |
| Ink B (com) | 0.044 | 0.049 | 0.043 | n/a | none | n/a |
| Ink C (com) | 0.141 | — | — | n/a | none | n/a |
| Ink C (com) | 0.141 | 0.152 | — | n/a | none | n/a |
| Ink C (com) | 0.141 | 0.152 | 0.031 | OK | good (3–4) | 68 |

[1]n/a means not applicable
[2]The conductive stripes were dip soldered for 5 seconds using standard eutectic PbSn solder. The numbers presented in parenthesis indicate the solder dip number at which dewetting occurred.
[3]Tensile pull tests were performed with a vertical post soldered to 4 mm² pads.

EXAMPLE 2

As described in Example 1, conductor stripes of the dimensions 6.20 cm in length×1.90 cm in width×0.030 cm in height were screen-printed onto FR-4 epoxy/glass coupons using experimental nickel based TLPS pastes. Curing and sintering was achieved by baking for 15 min. at a temperature of 215° C. The cured TLPS pastes comprised roughly 91 wt % metals and 9 wt % of an epoxy based organic polymer.

Sample preparation prior to plating was the same as in Example 1 above. However, it should be pointed out that, since Ni is a hydrogenation catalyst similar to palladium, Pd/Sn activation is in principle not necessary. The coupons were plated for one hour at 44° C. in an electroless copper sulfate/formaldehyde bath (CIRCUPOSIT® ELECTROLESS COPPER 3350). Rapid formation of a continuous, fine grained copper film of about 2–3 micron thickness was observed. All traces showed a significantly reduced resistance, excellent solderability and good adhesion of the plated copper. The conductive stripes were dip soldered using standard eutectic PbSn solder. Vertical pull-testing of the soldered samples gave values of 125–175 kg/cm². A summary of the findings is given in Table 2.

TABLE 2

Copper Electroless Plating of Ni-TLPS pastes

| Ni-TLPS Paste | Polished | Acid Dip | Pd/Sn Catalyst | R (Ω) Unpolished | R (Ω) 60 min. plated | Scotch Tape Test |
|---|---|---|---|---|---|---|
| 29-86-2 | no | yes | no | 0.3404 | 0.0278 | OK |
| 29-86-2 | no | yes | yes | 0.3203 | 0.0288 | OK |
| 35-45-1 | yes | yes | yes | 0.1990 | 0.0417 | OK |
| 35-45-2 | yes | yes | no | 0.2721 | 0.0425 | OK |
| 35-45-3 | yes | yes | no | 0.2179 | 0.0456 | OK |
| 35-45-4 | yes | yes | yes | 0.1672 | 0.0390 | OK |
| 35-45-5 | yes | yes | no | 0.0763 | 0.0338 | OK |
| 35-45-10 | yes | yes | yes | 0.0514 | 0.0197 | OK |

EXAMPLE 3

A photosensitive film was laminated to epoxy/glass substrate, and a serpentine pattern was photo-imaged deploying line widths of 3 mil to 12 mil. The 1 mil deep serpentine grooves obtained after development were filled with ORMET 2005 TLPS paste and a copper ink for comparison. Curing and sintering was achieved by baking for 15 min. at a temperature of 215° C. The cured TLPS pastes comprised roughly 91 wt % metal network and 9 wt % of an epoxy based organic polymer. The copper ink comprised about 88 wt % copper and 12 wt % of the same epoxy based organic polymer. Samples were mechanically abraded, dipped into acid and activated with a Pd/Sn activator. Electroless Cu plating was performed for 120 min at 48° C. in a CIRCUPOSIT® ELECTROLESS COPPER 3350 bath. Cross-sectioning of the plated samples and inspection by microscope showed that both types of conductive traces were plated with a 8 micron thick, continuous copper film. However, it should be noted that very fine traces (<6 mil) made from copper ink were sometimes only partially plated and exhibited strong signs of degradation. Larger areas of copper ink appear to plate up faster and thus escape attack by the alkaline bath. Very strong degradation under alkaline plating conditions was also observed for other experimental inks containing nickel or silver powders together with the epoxy based organic polymer. These results suggest that the metal network formed in TLPS paste traces protects them against chemical attack. The plated serpentine patterns could be dip soldered with good resolution of the fine traces using standard eutectic PbSn solder. A summary of the findings is given in Table 3.

TABLE 3

Resistance (Ω) of serpentine patterns after 120 min. of plating

|  | 12 mil | 6 mil |
|---|---|---|
| Cu-ink | 4040 | open |
| plated Cu ink | 40 | 59 |
| ORMET 2005 | 158 | 248 |
| plated ORMET 2005 | 29 | 48 |

EXAMPLE 5

Using the same plating method as described in Example 4 a serpentine conductor pattern with 2 mil spacings and 2 mil lines was fabricated on a 4.0×5.0 square inch area using ORMET 2005 TLPS paste. The pattern could be plated in an electroless copper plating bath for 120 min. at 44° C. without exhibiting signs of bridging.

EXAMPLE 6

Using the same method as described in Example 4, a conductive pattern typical for component attachment by wire bonding was created. Test coupons were polished, and subsequently dipped first into an acid bath and then into an activator bath. Electroless Cu plating was performed as described above in a CIRCUPOSIT® ELECTROLESS COPPER 3350 bath. Inspection by microscope showed that the copper-based TLPS paste was plated with a fine grained, 2–3 micron thick, continuous copper film. Subsequent to electroless copper plating, the pattern was electrolytically plated first with nickel and then with gold using standard, commercial baths. In each step a continuous and strongly adherent metal film was obtained.

EXAMPLE 7

Using the same method as described in Example 4, a conductive pattern typical for component attachment by wire bonding was created. Samples were polished and etched in an aqueous sulfuric acid/peroxide solution prior to electroplating with nickel or copper. Nickel plating was performed for 20 min. at 80° C. in an acid nickel sulfate bath (McDermid) using a current density of 5 A/square feet. Copper plating was performed in a technical acid copper (sulfuric acid) bath for 15 min. at 40° C. and a current density of 5 A/square feet. Inspection of cross-sectioned samples by microscope showed that the copper based TLPS paste was plated with 2–3 micron thick, continuous metal films. Both the nickel and copper films were resistant to scotch tape testing.

While the invention has been described in detail with reference to certain preferred embodiments thereof, it will be understood that modifications and variations are within the spirit and scope of that which is described and claimed.

That which is claimed is:

1. A method to apply a surface finish to a substrate, said method comprising:
    applying a transient-liquid-phase-sintering (TLPS) paste to said substrate, curing and sintering said TLPS paste, wherein said curing and sintering creates conductive surfaces, and plating the conductive surfaces.

2. A method according to claim 1 wherein said conductive surface is plated by electroless plating.

3. A method according to claim 1 wherein said conductive surface is plated by electrolytic plating.

4. A method according to claim 1 wherein said plating employs a metal selected from the group consisting of Ni, Cu, Ag, Au, Pd, SnPb, Zn and Sn.

5. A method according to claim 1 wherein said TLPS paste comprises a metal powder, a solder powder, a binder and a crosslinking agent.

6. A method according to claim 5 wherein said metal powder comprises at least one element selected from the Group consisting of Al, Cr, Mo, W, Fe, Co, Ni, Ru, Rh, Pd, Os, Ir, Pt, Cu, Ag, and Au, and the solder powder comprises one or more metals selected from the Group consisting of Au, Cu, Ag, Zn, Cd, Al, Ga, In, Ge, Sn, Pb, As, Sb, and Bi, or alloys thereof.

7. A method according to claim 5 wherein the binder comprises a thermosetting polymer and a latent or chemically protected crosslinking agent.

8. A method according to claim 1 wherein the sintered TLPS paste is activated for plating by mechanical abrasion, treatment with organic or inorganic acids or treatment with a hydrogenation catalyst.

9. A method to apply a surface finish to a substrate, said method comprising:
    curing and sintering a transient-liquid-phase-sintering (TLPS) paste which has been applied to said substrate, and
    plating the conductive surfaces created upon curing and sintering said TLPS paste.

10. A method to apply a surface finish to a substrate, said method comprising plating the conductive surfaces created by a transient-liquid-phase-sintering (TLPS) paste which has been applied to said substrate, cured and sintered.

11. A method for the preparation of a circuit trace, said method comprising:
    applying a transient-liquid-phase-sintering (TLPS) paste to the surface of a substrate in a desired pattern,
    curing and sintering said TLPS paste, and
    plating the conductive surfaces created upon curing and sintering said TLPS paste.

* * * * *